US008064233B2

United States Patent
Ishizu et al.

(10) Patent No.: US 8,064,233 B2
(45) Date of Patent: Nov. 22, 2011

(54) POWER SUPPLY REGULATING APPARATUS, SEMICONDUCTOR MANUFACTURING APPARATUS, METHOD FOR CONTROLLING POWER TO HEATER, AND METHOD FOR MANUFACTURING SEMICONDUCTOR DEVICE

(75) Inventors: Hideo Ishizu, Tokyo (JP); Masayuki Suzuki, Tokyo (JP)

(73) Assignees: Kokusai Electric Semiconductor Service Inc., Hamura-shi (JP); Sanko Co., Ltd., Tokyo (JP)

( * ) Notice: Subject to any disclaimer, the term of this patent is extended or adjusted under 35 U.S.C. 154(b) by 386 days.

(21) Appl. No.: 11/660,357

(22) PCT Filed: Aug. 12, 2005

(86) PCT No.: PCT/JP2005/014844
§ 371 (c)(1), (2), (4) Date: Mar. 29, 2007

(87) PCT Pub. No.: WO2006/019056
PCT Pub. Date: Feb. 23, 2006

(65) Prior Publication Data
US 2007/0287201 A1    Dec. 13, 2007

(30) Foreign Application Priority Data
Aug. 19, 2004 (JP) .................................. 2004-239455

(51) Int. Cl.
- H02M 7/5383 (2007.01)
- H02M 7/5387 (2007.01)
- H02M 7/53846 (2007.01)
- H02M 7/5395 (2006.01)

(52) U.S. Cl. ............ 363/97; 363/37; 219/663; 219/664; 219/665; 219/667; 219/668

(58) Field of Classification Search .................... 363/97, 363/108, 159, 160, 134, 34, 35, 37; 219/660, 219/661, 663, 664, 665, 667, 668
See application file for complete search history.

(56) References Cited

U.S. PATENT DOCUMENTS

| | | | |
|---|---|---|---|
| 4,540,866 A * | 9/1985 | Okuda ......................... 219/664 |
| 2001/0019856 A1* | 9/2001 | Takahashi et al. ............ 438/127 |
| 2003/0217559 A1 | 11/2003 | Ieda et al. |
| 2004/0094770 A1* | 5/2004 | Ogihara et al. ................. 257/79 |
| 2005/0169659 A1* | 8/2005 | Koyama et al. ................. 399/88 |

FOREIGN PATENT DOCUMENTS
JP    A 6-67737    3/1994
(Continued)

OTHER PUBLICATIONS
Japanese Office Action dated Apr. 20, 2011 for Japanese Patent Application No. 2006-531765 (with translation).

*Primary Examiner* — Gary L Laxton
*Assistant Examiner* — Nusrat Quddus
(74) *Attorney, Agent, or Firm* — Oliff & Berridge PLC

(57) ABSTRACT

A supplying power adjusting apparatus has excellent temperature response and excellent stabilities to power supply change and load change. The apparatus is provided with a semiconductor inverter for high-speed switching power control, which converts a direct current rectified by a rectifying circuit (10) into alternating current power in response to a control signal and supplies a heater (7) with the power; a temperature change detecting circuit (24) for detecting the temperature change of the heater (7); a power supply change detecting circuit (22) for detecting the power change of the rectifying circuit (10); a load change detecting circuit (23) for detecting the change of the alternating current power supplied to the heater (7); and a power control signal generating circuit (15) which calculates a power quantity to be supplied to the heater (7) and controls the frequency or duty ratio of a control signal to be added to the power controlling semiconductor inverter in response to the calculated results.

9 Claims, 7 Drawing Sheets

FOREIGN PATENT DOCUMENTS

| | | |
|---|---|---|
| JP | A 8-330050 | 12/1996 |
| JP | A 2002-266067 | 9/2002 |
| JP | A 2003-50520 | 2/2003 |
| JP | A-2003-335127 | 11/2003 |

* cited by examiner

RELATED ART

RELATED ART

POWER SUPPLY REGULATING APPARATUS, SEMICONDUCTOR MANUFACTURING APPARATUS, METHOD FOR CONTROLLING POWER TO HEATER, AND METHOD FOR MANUFACTURING SEMICONDUCTOR DEVICE

TECHNICAL FIELD

The present invention relates to a power supply regulating apparatus for regulating power supplied to a heater, a semiconductor manufacturing apparatus in which the power supply regulating apparatus is mounted, a method for controlling power to a heater, and a method for manufacturing a semiconductor device.

BACKGROUND ART

FIG. 2 shows a conventional power supply regulating apparatus for a heater. The power supply regulating apparatus 20 for a heater has an electricity receiving terminal table 2 connected to an AC power source 1 at the input terminals of the apparatus, and has a terminal table for distribution 6 connected to a heater 7 at the output terminals of the power supply regulating apparatus. A power source breaker 3, a power source transformer 4, and a power control thyristor 5 as a power regulator are connected between the electricity receiving terminal table 2 and the terminal table for distribution 6. A thermometric thermocouple 8 is disposed in the heater 7.

Power is received at the electricity receiving terminal table 2 from the AC power source 1, and the power is supplied to the power source transformer 4 via the power source breaker 3. The power transformed by the power source transformer 4 is controlled by the power control thyristor 5 and supplied from the terminal table for distribution 6 to the heater 7. The heater 7 is heated thereby, and the temperature of the heater 7 changes. The heater temperature is measured with the aid of the thermocouple 8 and inputted to a temperature controller 9. The temperature controller 9 calculates the difference between the set temperature and the measured temperature measured with the aid of the thermocouple 8, and calculates the amount of electric power to be supplied to the heater 7 in accordance with the temperature difference. The result of the calculation is converted to a phase control amount and outputted as a control signal from the temperature controller 9 to the power control thyristor 5. The power control thyristor 5 supplies power to the heater 7 in correlation with the timing of the control signal.

In this manner, the power supply regulating apparatus 20 for a heater senses the heater temperature, subsequently determines the timing for outputting control signals with the aid of the temperature controller 9, controls the phase of the power control thyristor 5 in accordance with the timing, and thereby brings the temperature of the heater 7 to the set temperature.

The method of controlling the phase is shown in FIG. 3. FIG. 3A shows a power waveform of an AC power source, and FIG. 3B shows the power-controlling thyristor control signal for controlling the power control thyristor. In each cycle of the AC power source in the phase control method, the power control interval A is the interval that begins with the generation of a power-controlling thyristor control signal and ends when the power waveform is at zero volts, and the reactive power interval B is the interval that begins at zero volts and ends with the generation of a control signal. There is a need for a power source in which the maximum power is higher than the power required when the temperature is stable. Therefore, the effective power when the temperature is stable is about 60 to 80% of the maximum power, and the rest is reactive power. Hence, the efficiency of such a power source is poor.

Attempts have been made to improve this situation, including the adoption of zero crossing control in which the reactive power is substantially not generated, and increasing the ratio of the effective power to 85% or higher with the aid of a phase advance capacitor for improving the power factor.

Zero crossing control has the same circuit implementation as in FIG. 2. Rather than adopting a thyristor as a power control element, however, an SSR (solid-state relay) is generally adopted. This approach is different in that the content of the control signal is changed. The method of this zero crossing control is shown in FIG. 4. FIG. 4A shows the power waveform of the AC power source; and FIG. 4B shows the power-controlling SSR control signal for controlling the SSR. An ignition method is adopted for turning on the SSR when the power waveform is zero volts. In this method, the prescribed time (A+B) of the AC power source is a single cycle (single cycle time), the power control interval A is the interval in which a power-regulating SSR control signal is outputted and [the SSR] (*1) is energized, and the non-energized interval B is any other interval in which power is not consumed. Zero crossing control acts only to turn the power source on or off, and reactive power is substantially not generated.

FIG. 5 shows the control method using a phase advance capacitor. The solid line in FIG. 5a shows a supply-side AC power source waveform W1, and the dotted line shows a control-side power source waveform. FIG. 5b shows a control signal of the power control thyristor. The reactive power interval B is long when the supply-side AC power source waveform W1 indicated by the solid line is controlled by the control signal. Therefore, the power control in the case of the phase angle P1 does not rise above 70%, for example. However, the reactive power interval B is reduced by an amount commensurate with the advance of the phase angle P2, the apparent power factor is improved, and power control increases to 90%, when the control-side power source waveform W2, which is indicated by the dotted line and whose phase has been advanced by the phase advance capacitor, is controlled with the aid of the control signal of the power control thyristor.

In the case of zero crossing control, however, an SSR having a relatively large on-voltage in comparison with a semiconductor for high speed power control such as IGBT (Insulated Gate Bipolar Transistor) is used as the power control element, and the heater temperature response is degraded. In the case of a phase advance capacitor, power regulation for limiting the profile is required until maximum power is reached because of the compensation of the phase advance capacitor. Because the phase is advanced in this case, an open phase is produced when a maximum power is abruptly applied. The system is therefore made difficult to use.

SUMMARY OF THE INVENTION

Figure 1:
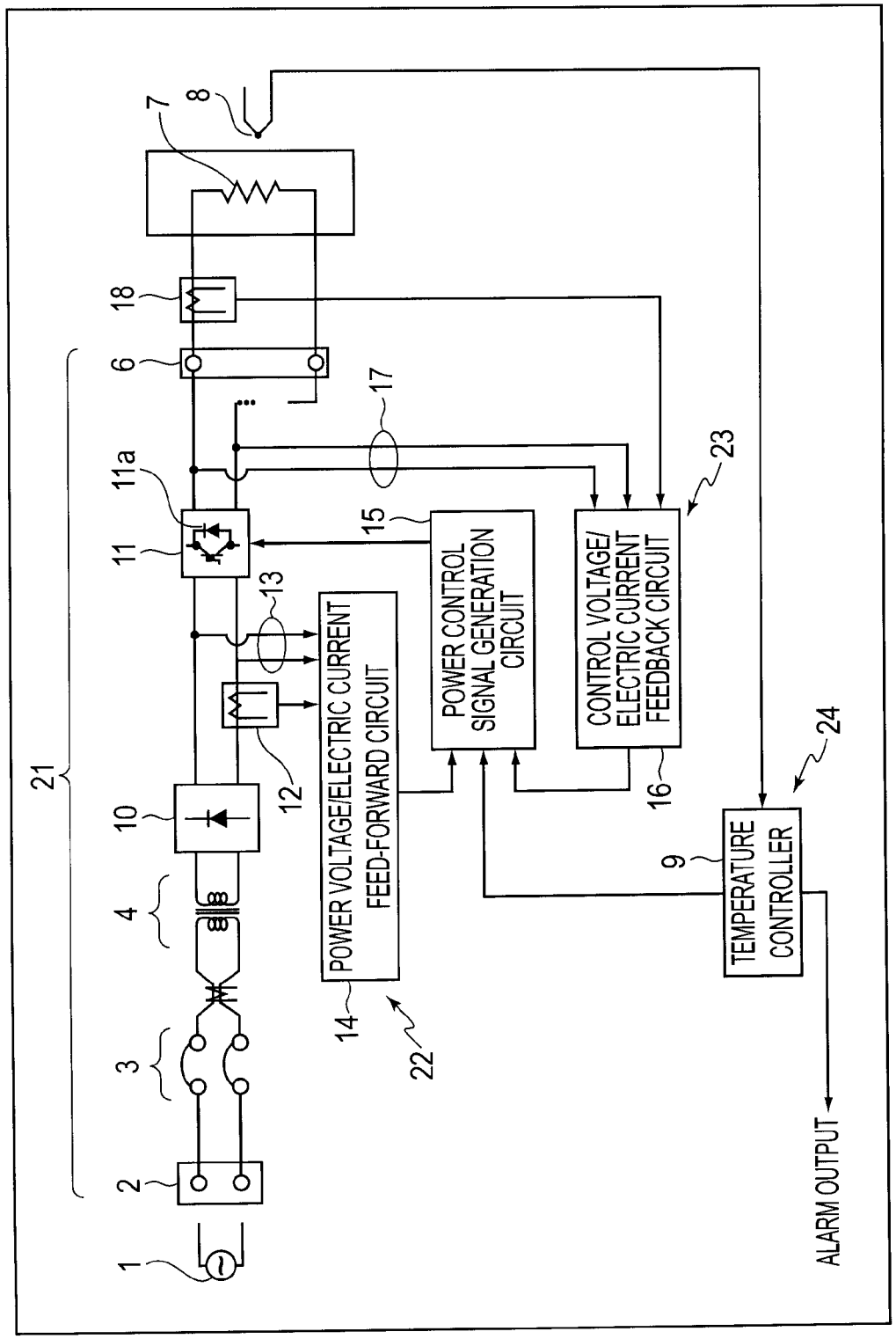
FIG. 1 is a block diagram of the power supply regulating apparatus of an embodiment.
Figure 2:
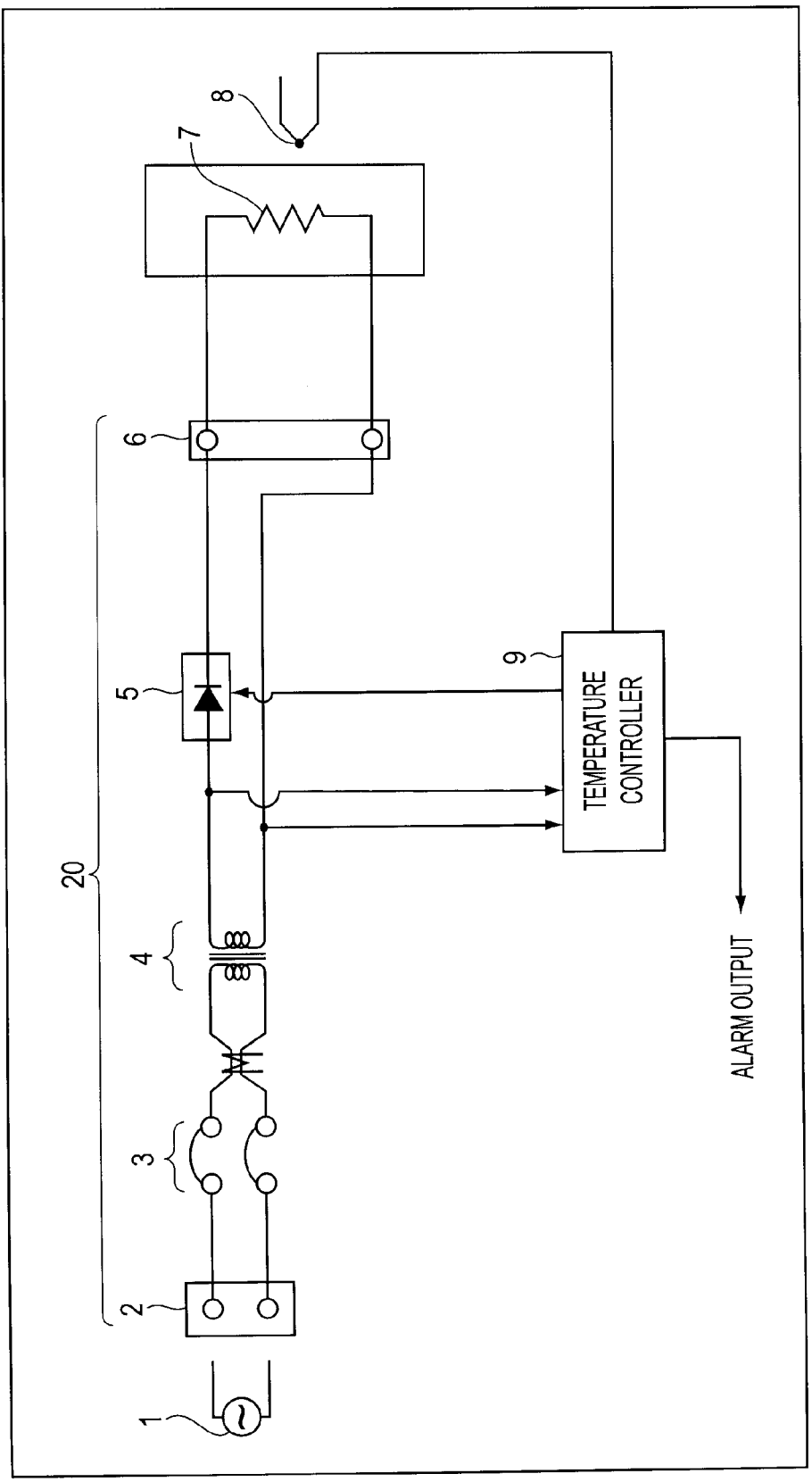
FIG. 2 is a block diagram of a conventional power supply regulating apparatus.
Figure 3:
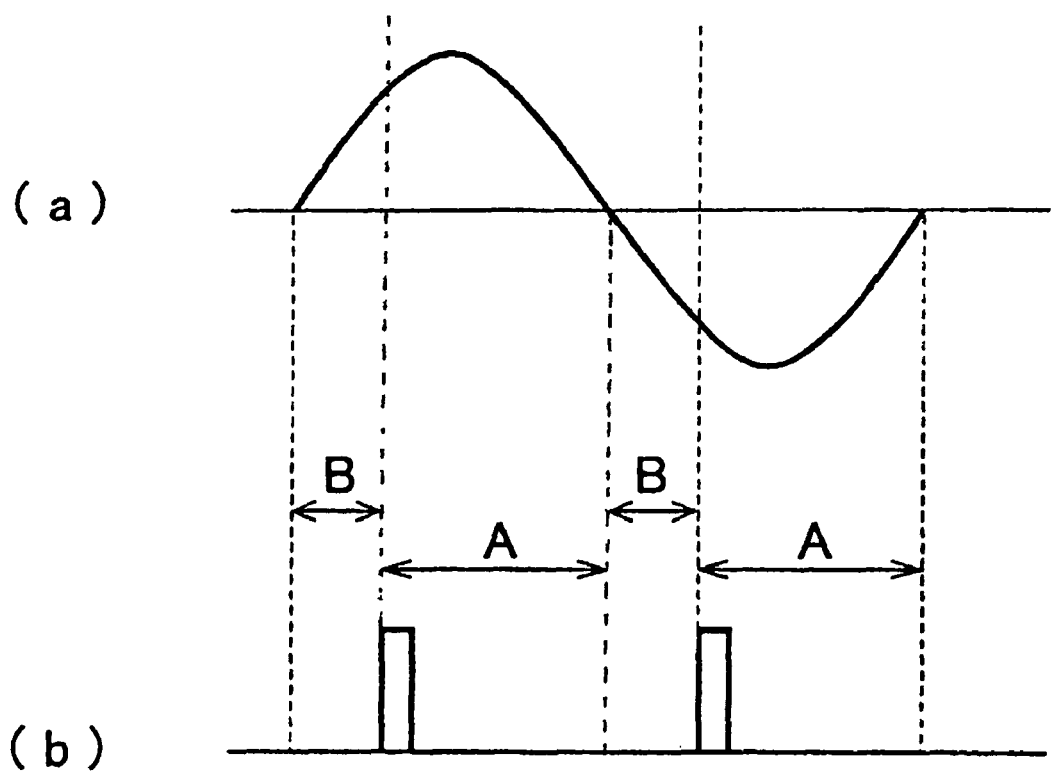
FIG. 3 is an explanatory diagram of the method for supplying power using conventional phase control.
Figure 4:
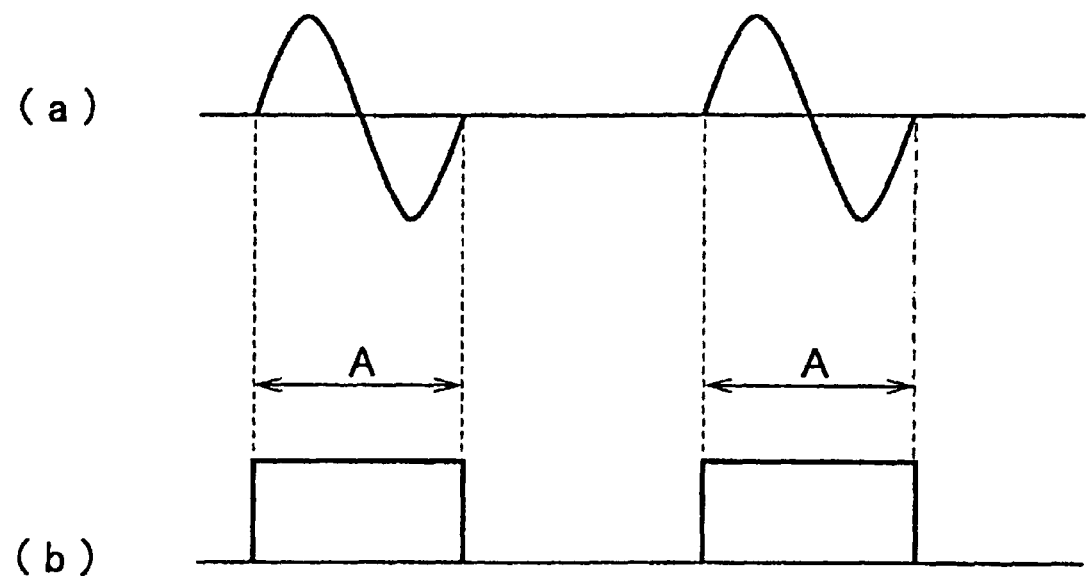
FIG. 4 is an explanatory diagram of the method for imparting power using zero crossing control according to a conventional method and the method of the working example.
Figure 5:
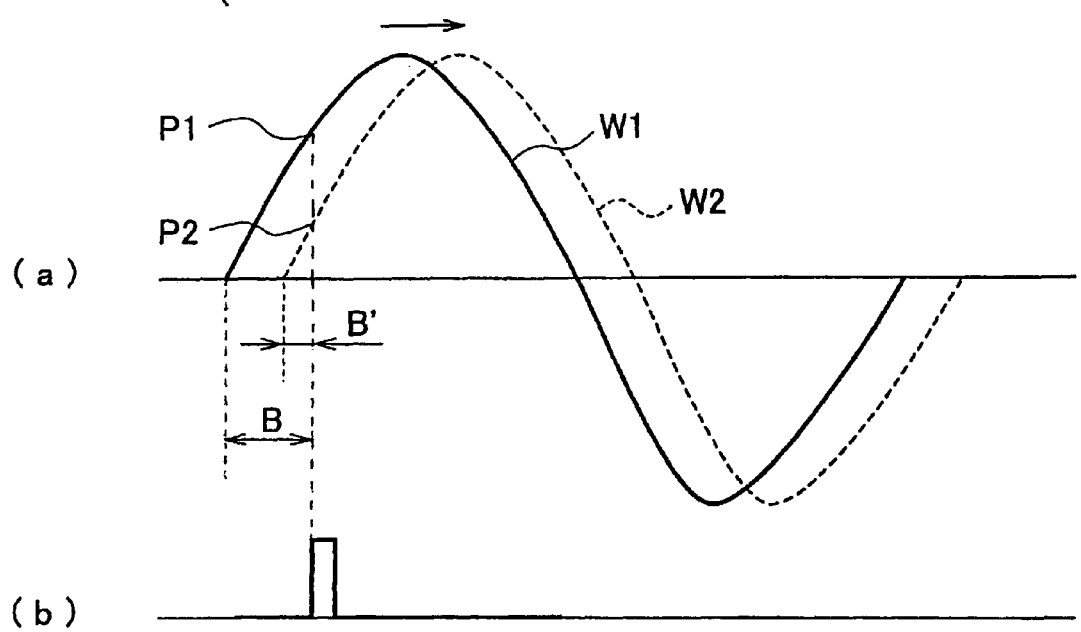
FIG. 5 is an explanatory diagram of the improvement in the power factor according to a conventional phase advance capacitor method.

As described above, when a power control thyristor controls the temperature with the aid of zero crossing control in a conventional power supply regulating apparatus, the temperature response characteristics are degraded. In the case of a phase advance capacitor, power regulation for limiting the profile is required until maximum power is reached, making the system difficult to use. Stability in relation to power source fluctuations and load fluctuations is poor because measures have not been taken with respect to power source fluctuations and load fluctuations, which can be said for both the power control thyristor and the phase advance capacitor.

An object of the present invention is to provide an easy-to-use power supply regulating apparatus, a semiconductor manufacturing apparatus, a method for controlling power to a heater, and a method for manufacturing a semiconductor device, in which the above-mentioned problems of conventional techniques are resolved, the temperature response characteristics are excellent, and the stability in relation to power source and load fluctuations is good.

A first aspect of the present invention provides a power supply regulating apparatus for supplying power from an AC power source to a heater, comprising a rectifier circuit for rectifying alternating current supplied from the AC power source into direct current; a semiconductor inverter for high-speed switching power control for converting direct current rectified in the rectifier circuit to AC power correlated with a control signal, and supplying [the AC power] to the heater; a temperature fluctuation detection circuit for detecting temperature fluctuations of the heater; a power source fluctuation detection circuit for detecting power fluctuations in alternating current supplied from the AC power source to the rectifier circuit, or in direct current rectified in the rectifier circuit; a load fluctuation detection circuit for detecting fluctuations in the AC power supplied to the heater; and a power control signal generation circuit for calculating the amount of electric power to be supplied to the heater on the basis of detection results of the temperature fluctuation detection circuit, the power source fluctuation detection circuit, and the load fluctuation detection circuit, and controlling the duty ratio or the frequency of the control signal applied to the semiconductor inverter for power control in accordance with the calculation results.

Power supply to a heater can be controlled using feedback in relation to temperature fluctuations by detecting temperature fluctuations with aid of a temperature fluctuation detection circuit, calculating the amount of electric power in accordance with the detection results with the aid of a power control signal generation circuit, and controlling the duty ratio or frequency of a semiconductor inverter for high-speed switching power control in accordance with the calculation results.

When the AC power voltage fluctuates, the fluctuations appear as power fluctuations on the input and output sides of the rectifier circuit. Power supply with respect to power voltage fluctuations is controlled via feed-forward control by, for example, detecting power fluctuations of the output side of the rectifier circuit, calculating the amount of electric power in accordance with the detection results with the aid of a power control signal generation circuit, and controlling the duty ratio or frequency of a semiconductor inverter for high-speed switching power control in accordance with the calculation results. Therefore, adequate feedback control makes it possible to suppress any disturbance in the heater temperature brought about by fluctuations in the power voltage and fluctuations in the amount of power supplied to the heater.

When the load fluctuates, the fluctuations appear as fluctuations in the power supplied to the heater. The power supply with respect to power voltage fluctuations is controlled via feedback by detecting power fluctuations to the heater with the aid of the load fluctuation detection circuit, calculating the amount of electric power in accordance with the detection results with the aid of a power control signal generation circuit, and controlling the duty ratio or frequency of a semiconductor inverter for high-speed switching power control in accordance with the calculation results. Therefore, adequate feedback control makes it possible to suppress any disturbance in the heater temperature brought about by load fluctuations and by the considerable disturbance, caused by the load fluctuations, in the control of the amount of power supplied to the heater.

In this manner, feed-forward control for power source fluctuations and feedback control for load fluctuations are incorporated into the feedback control of temperature control by using a semiconductor inverter for high-speed switching control. Therefore, temperature stability can be obtained, a very high level of stability in relation to power source fluctuations and load fluctuations can be achieved, and very high stability can be obtained in the heater temperature. Temperature response characteristics are excellent because a semiconductor for high-speed switching power control is used as the power control element. The ease of use is also improved because control does not depend on correction by a phase advance capacitor.

A second aspect of the present invention is the power supply regulating apparatus of the first aspect, wherein the semiconductor inverter for power control is composed of an IGBT.

Transient response characteristics in particular are excellent because an IGBT is used as the semiconductor inverter for power control. Zero crossing control used for controlling the frequency of the IGBT, and the power source efficiency is therefore improved.

A third aspect of the present invention provides a semiconductor manufacturing apparatus that has the power supply regulating apparatus of the first or second aspect. A high performance semiconductor device can be manufactured because the power supply regulating apparatus of the first or second aspect of the present invention is provided whereby high stability can be obtained in the heater temperature.

A fourth aspect of the present invention provides a power supply regulating apparatus for supplying power from an AC power source, having a rectifier circuit for rectifying a first AC power supplied from the AC power source; a power control circuit for converting power rectified in the rectifier circuit into a second AC power correlated with a control signal, and supplying [the AC power] to the heater; a temperature fluctuation detection circuit for detecting temperature fluctuations of the heater; a power source fluctuation detection circuit for detecting power fluctuations in the first AC power supplied from the AC power source to the rectifier circuit, or in the power rectified in the rectifier circuit; a load fluctuation detection circuit for detecting fluctuations in the second AC power supplied to the heater; and a power control signal generation circuit for calculating the amount of electric power to be supplied to the heater on the basis of detection results of the temperature fluctuation detection circuit, the power source fluctuation detection circuit, and the load fluctuation detection circuit, and controlling the duty ratio or the frequency of the control signal applied to the power control circuit in accordance with the calculation results.

Feed-forward control for power source fluctuations and feedback control for load fluctuations are incorporated into the feedback control of temperature control by using a power control circuit. It is therefore possible to obtain temperature stability, power source fluctuations, a very high level of stability in relation to load fluctuations, and high stability in the heater temperature.

A fifth aspect of the present invention provides a power supply regulating apparatus for supplying power from an AC power source to a heater, having a rectifier circuit for rectifying a first AC power supplied from the AC power source; a power control circuit for converting power rectified in the rectifier circuit into a second AC power correlated with a control signal, and supplying [the second AC power] to the heater; a temperature fluctuation detection circuit for detecting temperature fluctuations of the heater; a power source fluctuation detection circuit for detecting power fluctuations in the first AC power supplied from the AC power source to the rectifier circuit, or in the power rectified in the rectifier circuit; and a power control signal generation circuit for calculating the amount of electric power to be supplied to the heater on the basis of detection results of the temperature fluctuation detection circuit and the power source fluctuation detection circuit, and controlling the duty ratio or the frequency of the control signal applied to the power control circuit in accordance with the calculation results.

Feed-forward control for power source fluctuations is incorporated into the feedback control of temperature control by using a power control circuit. It is therefore possible to obtain temperature stability, a very high level of stability in relation to power source fluctuations, and high stability in the heater temperature.

A sixth aspect of the present invention provides a power supply regulating apparatus for supplying power from an AC power source to a heater, having a rectifier circuit for rectifying a first AC power supplied from the AC power source; a power control circuit for converting power rectified in the rectifier circuit into a second AC power correlated with a control signal, and supplying [the AC power] to the heater; a temperature fluctuation detection circuit for detecting temperature fluctuations of the heater; a load fluctuation detection circuit for detecting fluctuations in the second AC power supplied to the heater; and a power control signal generation circuit for calculating the amount of electric power to be supplied to the heater on the basis of detection results of the temperature fluctuation detection circuit and the load fluctuation detection circuit, and controlling the duty ratio or the frequency of the control signal applied to the power control circuit in accordance with the calculation results.

Feedback control for load fluctuations is incorporated into the feedback control of temperature control by using a power control circuit. It is therefore possible to obtain temperature stability, a very high level of stability in relation to load source fluctuations, and very high stability in the heater temperature.

A seventh aspect of the present invention provides a method for controlling power to a heater, comprising rectifying a first AC power supplied from an AC power source, converting the power by a power control circuit to a second AC power correlated with a control signal inputted to the power control circuit, and supplying the power to a heater, the method further comprising detecting temperature fluctuations of the heater, power fluctuations in the rectified output prior to conversion to the first AC power and the second AC power, and fluctuations in the second AC power supplied to the heater; and calculating the amount of electric power to be supplied to the heater on the basis of the detection results and controlling the duty ratio or the frequency of the control signal in accordance with the calculation results.

Feed-forward control for power source fluctuations and feedback control for load fluctuations are incorporated into the feedback control of temperature control by using a power control circuit. It is therefore possible to obtain temperature stability, a very high level of stability in relation to load fluctuations, and very high stability in the heater temperature.

An eighth aspect of the present invention provides a method for manufacturing a semiconductor device, comprising rectifying a first AC power supplied from an AC power source, converting the power to a second AC power correlated with a control signal, and supplying the power to a heater for thermal process of a semiconductor manufacturing apparatus, the method further comprising detecting temperature fluctuations of the heater for thermal process, power fluctuations in the rectified output prior to conversion to the first AC power and the second AC power; and calculating the amount of electric power to be supplied to the heater for thermal process on the basis of the detection results and controlling the duty ratio or the frequency of the control signal in accordance with the calculation results.

Feed-forward control for power source fluctuations is incorporated into the feedback control of temperature control. It is therefore possible to obtain temperature stability, a very high level of stability in relation to power source fluctuations, and very high stability in the heater temperature.

A ninth aspect of the present invention provides a method for manufacturing a semiconductor device, comprising rectifying a first AC power supplied from an AC power source, converting the power to a second AC power correlated with a control signal, and supplying the power to a heater for thermal process of a semiconductor manufacturing apparatus, the method further comprising detecting temperature fluctuations of the heater for thermal process, and fluctuations in the second AC power supplied to the heater for thermal process; and calculating the amount of electric power to be supplied to the heater for thermal process on the basis of the detection results, and controlling the duty ratio or the frequency of the control signal in accordance with the calculation results.

Feed-forward control for load fluctuations is incorporated into the feedback control of temperature control. It is therefore possible to obtain temperature stability, a very high level of stability in relation to power source fluctuations, and very high stability in the heater temperature.

The present invention provides an easy-to-use apparatus and method in which the temperature response characteristics are excellent, and the stability in relation to power source and load fluctuations is good.

BEST MODE FOR CARRYING OUT THE INVENTION

Embodiments of the power supply regulating apparatus of the present invention are described below.

The power supply regulating apparatus according to the embodiments supplies power to a heater on the basis of control calculation results obtained in a controller, and uses a semiconductor element inverter (*2) for high-speed switching power control such as an IGBT as the power control circuit of the controller. A power source can be effectively used by initially rectifying AC power into direct current, supplying a heater with power obtained by controlling the duty ratio or the frequency of the rectified direct current using an IGBT inverter, and setting the reactive power to substantially zero. Alternatively, AC power can be half-wave rectified, converted to power whose duty ratio or frequency has been controlled by the IGBT inverter, and supplied to a heater.

A power supply regulating apparatus 21 that supplies power from an AC power source 1 to a heater 7 is provided with an electricity receiving terminal table 2 that connects to the AC power source 1 at the input terminals of the power supply regulating apparatus, and is provided with a terminal table for distribution 6 that connects to the heater 7 at the output terminals of the power supply regulating apparatus, as shown in FIG. 1. The AC power source 1 is a commercially available power source that supplies a first AC power at frequency of 50/60 Hz and an AC voltage of 200 V. The heater 7 is a molybdenum disilicide resistance heater, for example.

A power source breaker 3 is connected to the electricity receiving terminal table 2, and a power source transformer 4 is also connected as required. Power received from the AC power source 1 at the electricity receiving terminal table 2 passes through the power source breaker 3 and is supplied to the power source transformer 4. The power source transformer 4 may not be used depending on the specifications of the heater 7. Depending on the power supply regulating apparatus, a plurality of semiconductor inverters 11 for power control may be used to divide the heater 7 into a plurality of regions to allow separate power control.

The secondary side of the power source transformer 4 has a rectifier circuit 10 and a power control circuit, e.g., a semiconductor inverter 11 for power control, as well as a power source fluctuation detection circuit 22, a load fluctuation detection circuit 23, a temperature fluctuation detection circuit 24, and a power control signal generation circuit 15. The power transformed by the power source transformer 4 passes through the rectifier circuit 10; is supplied to the semiconductor inverter 11 for power control, which is controlled by the power control signal generation circuit 15; and is applied to the heater 7 connected to the terminal table for distribution 6.

The rectifier circuit 10 rectifies the alternating current of the AC power source 1 into direct current. This is because the power, having initially been rectified, will again be changed into alternating current in the inverter 11 and supplied to the heater 7.

The semiconductor inverter 11 for power control converts the direct current rectified in the rectifier circuit 10 into second AC power and supplies the second AC power to the heater 7. The semiconductor inverter for high-speed switching power control supplies AC power to the heater 7 in accordance with the duty ratio of the frequency of the control signal applied from the power control signal generation circuit 15. The semiconductor element used in the semiconductor inverter 11 for high-speed switching power control is a high-frequency, large-capacity element, and a semiconductor element that has a much lower on-voltage than a MOSFET (SSR), e.g., an IGBT element, is used. The IGBT inverter 11a converts the frequency in order to reduce reactive power.

The temperature fluctuation detection circuit 24 detects temperature fluctuations of the heater 7 and outputs feedback signals correlated with the fluctuations to the power control signal generation circuit 15. The temperature fluctuation detection circuit 24 has a thermometric thermocouple 8 as a temperature sensor, and a temperature controller 9 for adjusting the temperature of the heater.

A required number of thermometric thermocouples 8 are disposed in the vicinity of the heater 7 and [the thermocouples] measure the temperature of the heater with the aid of thermoelectric force. The temperature controller 9 calculates the temperature difference (temperature fluctuations) between the set temperature and the measured temperature of the heater measured by the thermocouple 8. The amount of electric power to be supplied to the heater 7 is calculated in accordance with the temperature difference, and the calculation results are outputted as feedback signals to the power control signal generation circuit 15. The temperature controller 9 outputs an alarm when a temperature abnormality has been detected. The temperature controller 9 presents the output to the power control signal generation circuit 15. Therefore, a conventional temperature controller can be used unchanged by merely modifying the program.

The power source fluctuation detection circuit 22 detects fluctuations in the output power of the rectifier circuit 10 and outputs feed-forward signals correlated with the fluctuations to the power control signal generation circuit 15. The power source fluctuation detection circuit 22 has an electric current transformer 12 that measures the current flowing at the output of the rectifier circuit 10, voltage measurement lines 13 that measure the voltage between the output lines of the rectifier circuit 10, and a power voltage/electric current feed-forward circuit 14. In order to detect fluctuations of the output power, the power voltage/electric current feed-forward circuit 14 calculates the difference between a set voltage and the measurement voltage measured in the electric current transformer 12, and the difference between the set voltage and the measured voltage measured in the voltage measurement lines 13. These differences represent power source fluctuations. The amount of electric power to be supplied to the heater 7 is calculated in accordance with the power fluctuations, and the calculation results are outputted as feed-forward signals to the power control signal generation circuit 15. The power source fluctuation detection circuit 22 may also be disposed on the input side rather than the output side of the rectifier circuit 10, i.e., between the AC power source 1 and rectifier circuit 10.

The load fluctuation detection circuit 23 detects fluctuations in the output power supplied to the heater 7 and outputs feedback signals correlated with the fluctuations to the power control signal generation circuit 15. The load fluctuation detection circuit 23 has voltage measurement lines 17 that measure the voltage between the output lines of the IGBT inverter 11a, an electric current transformer 18 that measures the current flowing at the output of the IGBT inverter 11a, and a control voltage/electric current feedback circuit 16. In order to detect load fluctuations, the control voltage/electric current feedback circuit 16 calculates the difference between a set voltage and the measurement voltage measured in the voltage measurement lines 17, and the difference between the set current and the measured current measured in the electric current transformer 18. These differences are load fluctuations. The amount of electric power to be supplied to the heater 7 is calculated in accordance with the load fluctuations, and the calculation results are outputted as feedback signals to the power control signal generation circuit 15.

The electric current transformer 18 is preferably disposed toward the heater 7 externally (on the output side) relative to the terminal table for distribution 6 in order to measure the fluctuations of the load current with good precision, but the may also be disposed on the input side of the terminal table for distribution 6.

The power control signal generation circuit 15 controls the duty ratio or the frequency of the IGBT inverter 11a in accordance with the fluctuation results of the temperature fluctuation detection circuit 24, power source fluctuation detection circuit 22, and load fluctuation detection circuit 23. Specifically, the power control signal generation circuit 15 calculates the amount of electric power to be supplied to the heater 7 on the basis of signals outputted from the temperature controller 9 of the temperature fluctuation detection circuit 24, the power voltage/electric current feed-forward circuit 14 of the power source fluctuation detection circuit 22, and the control voltage/electric current feedback circuit 16 of the load fluctuation detection circuit 23, and presents the IGBT inverter 11a with a gate control signal having a duty ratio or frequency that is in accordance with the calculation result.

The power applied to the heater 7 is controlled by continuously varying the output frequency in cases in which frequency is used to control the IGBT. The control characteristics of the power improve as the variability of the frequency increases. For this reason, the gate control signal outputted from the power control signal generation circuit 15 can be continuously varied between a frequency of zero and a frequency that is higher than the frequency (e.g., 300 Hz) of the power source. When the alternating current of the AC power source 1 is converted to direct current and then converted back to alternating current in the IGBT, the effect of the counter electric power that is generated due to load inductance factors cannot be ignored when the frequency is greater than 300 Hz, and such a situation is not desirable. The frequency control performed by the power control signal generation circuit 15 is the same as the VF (variable frequency) control of VVVF control in that the frequency is varied. The IGBT can be PWM control in which the duty ratio is controlled while the base frequency is kept constant. Both VF control and PWM control represent zero crossing control because the IGBT is switched on when the voltage is zero.

In the power supply regulating apparatus 21 according to the embodiment described above, the temperature controller 9 and power control signal generation circuit 15 control the temperature of the heater 7 in the following manner so that the set temperature is achieved.

The temperature controller 9 determines the temperature difference between the measured temperature and the set temperature, calculates the amount of electric power to be supplied to the heater 7 in accordance with the temperature difference, and outputs the calculation results to the power control signal generation circuit 15. The power control signal generation circuit 15 presents the IGBT inverter 11a with a gate control signal. The signal carries the duty ratio or frequency that is in correlation with the output value from the temperature controller 9. The IGBT inverter 11a converts the DC power from the rectifier circuit 10 into AC power whose duty ratio or frequency corresponds to the gate control signal of the power control signal generation circuit 15, and supplies [the AC power] to the heater 7. Power is supplied to the heater 7 in order to vary the temperature of the heater 7.

Feedback control is carried out in a closed loop composed of temperature fluctuation detection, control calculation, outputting of output values, temperature variation, temperature fluctuation detection, and the like. The temperature state is detected and the output amount is thereafter determined by the temperature controller 9 and the power control signal generation circuit 15, and feedback control can therefore be smoothly carried out. Accordingly, the temperature fluctuations of the heater can be corrected, stable power can be supplied to the heater 7, and the heater 7 can be kept at a prescribed temperature. Since the frequency and duty ratio control are zero crossing control, reactive power is not generated and highly efficient control can be achieved.

When the temperature of the heater is being smoothly controlled via feedback in the manner described above, electric current and voltage fluctuations appear in the output of the rectifier circuit 10 when the voltage of the AC power source 1 fluctuates. These electric current and voltage fluctuations are measured in the electric current transformer 12 and the voltage measurement lines 13, and are detected by the power voltage/electric current feed-forward circuit 14. Control signals correlated with the power fluctuations are inputted from the power voltage/electric current feed-forward circuit 14 to the power control signal generation circuit 15. The power control signal generation circuit 15 outputs a gate control signal whose duty ratio and frequency correspond to the difference between the power of the power source and the power that has been set. The gate control signal is presented to the IGBT inverter 11a, and the IGBT inverter is controlled using duty ratio or frequency control. Therefore, the voltage fluctuation of the AC power source 1 can be compensated and stable power can be supplied to the heater 7. Since frequency control is zero crossing control, reactive power is not generated and highly efficient control can be achieved. The response characteristics from the rectifier circuit (DC power source) 10 to the thermocouple 8 are improved by feed-forward control.

When the temperature of the heater is being smoothly controlled via feedback in the manner described above, and there is disturbance (e.g., contact with outside air) in the heater 7 or the properties of the heater have varied somewhat to produce load fluctuations, these [sources of fluctuations] appear in the power output of the IGBT inverter 11a. In other words, the load current that flows to the heater 7 and the load voltage applied to the heater 7 will fluctuate. These electric current and voltage fluctuations are detected by the electric current transformer 18 and voltage measurement lines 17, and measured by the control voltage/electric current feedback circuit 16. Control signals correlated with the power fluctuations are inputted from the control voltage/electric current feedback circuit 16 to the power control signal generation circuit 15. The power control signal generation circuit 15 outputs a gate control signal whose duty ratio and frequency corresponds to the difference between the power of the power source and the power that has been set. The gate control signal is presented to the IGBT inverter 11a to perform duty ratio control or frequency control. Therefore, the load fluctuation can be compensated and stable power can be supplied to the heater 7. Since frequency control or duty ratio control is zero crossing control, reactive power is not generated and highly efficient control can be achieved.

In comparison with temperature control, which entails three steps, i.e., disturbance, heater temperature variation, and thermocouple detection, load fluctuation control has two steps, i.e., detection of disturbances and detection of power fluctuations. Since the thermocouple detection step can be omitted, the response characteristics are rapid.

In this manner, feed-forward control for power source fluctuations and feedback control for load fluctuations are incorporated into the feedback control of temperature control by using a high-frequency, large-capacity IGBT as the element constituting the semiconductor inverter for high-speed switching power control. Therefore, temperature stability can be obtained, a very high level of stability in relation to power source fluctuations and load fluctuations can be achieved, and high stability can be obtained in the heater temperature. In particular, incorporating power source voltage fluctuations and load fluctuations in addition to temperature fluctuations is made possible by adopting an IGBT, which is a high-frequency, large-capacity element.

Figure 6:
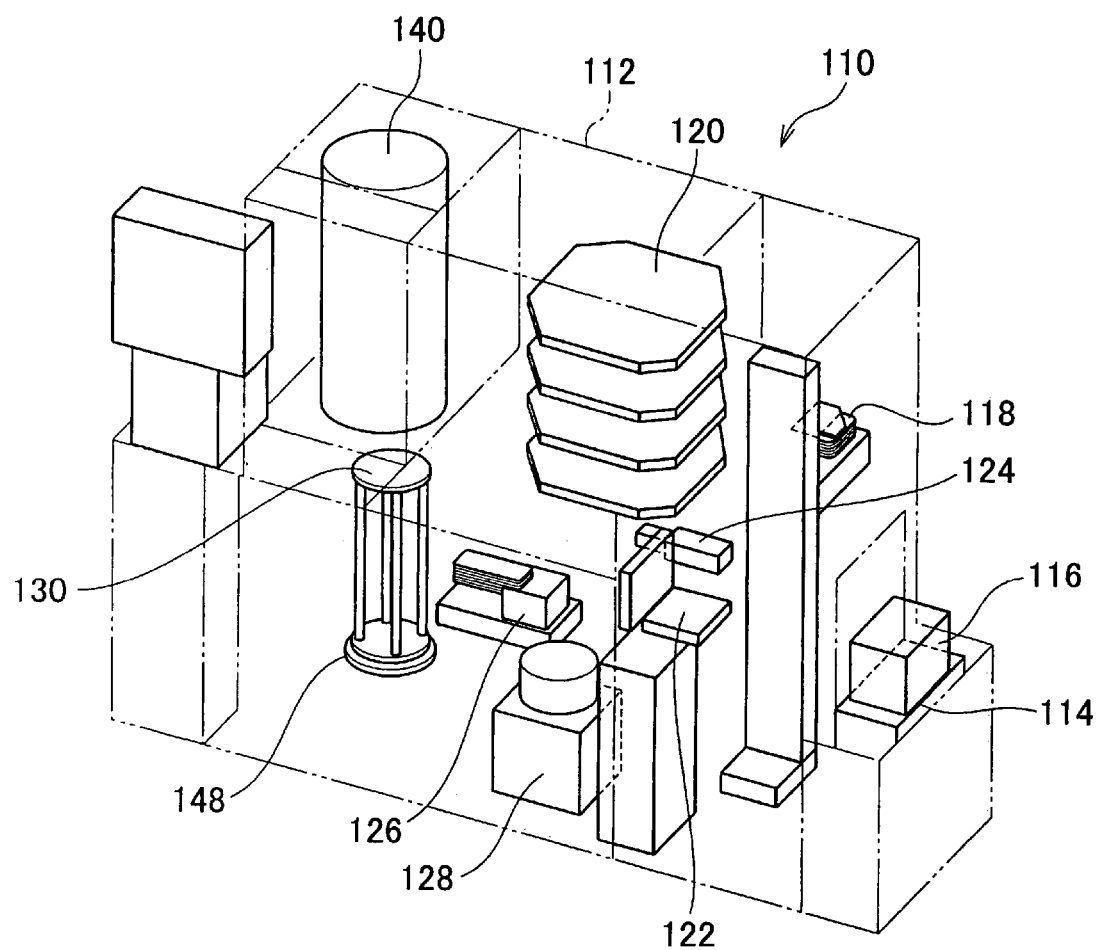
FIG. 6 is an oblique perspective view showing an example of a thermal process apparatus for thermal processing a semiconductor substrate, which is a process for manufacturing a semiconductor device according to an embodiment of the present invention.

FIG. 6 shows an example of a thermal process apparatus 110 for thermal processing a semiconductor substrate, which is a process for manufacturing a semiconductor device according to an embodiment of the present invention. This thermal process apparatus 110 is a batch-type vertical thermal process apparatus, and has a case 112 in which the main components are disposed.

A reactor 140 is disposed in the upper portion against the back surface in the interior of the case 112. A substrate support 130 that is filled with a plurality of substrates is transported into the reactor 140 and thermal process is performed.

Figure 7:
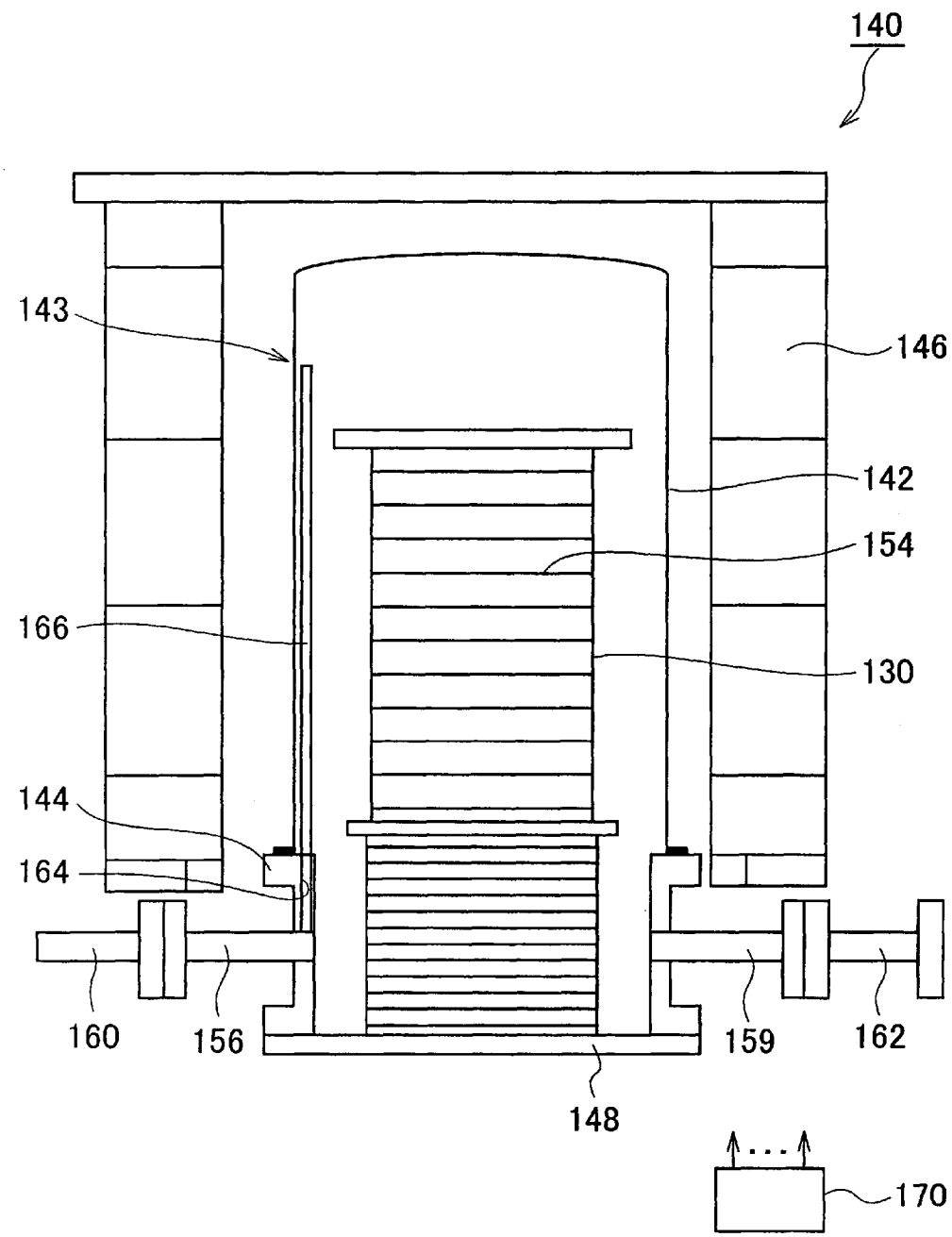
FIG. 7 is a longitudinal sectional view showing an example of the reactor 140.

FIG. 7 shows an example of the reactor 140. The reactor 140 has a reaction tube 142 made of quartz. The reaction tube 142 has a cylindrical shape that is closed at the upper end and is open at the lower end. An adapter 144 made of stainless steel is disposed at the lower end of the reaction tube 142 so as to support the reaction tube 142. A reaction vessel 143 is formed by the reaction tube 142 and adapter 144. A heater for thermal process (hereinafter simply referred to as heater 146) is disposed about the periphery of the reaction vessel 143, which includes the reaction tube 142 but excludes the adapter 144.

The lower portion of the reaction vessel 143 formed by the reaction tube 142 and adapter 144 is open so that the substrate support 130 can be inserted, and the open portion (furnace port portion) is sealed by bringing a seal cap 148 of the furnace port into contact with the bottom surface of the lower end flange of the adapter 144. The seal cap 148 of the furnace port supports the substrate support 130 and is elevatably disposed together with the substrate support 130. The substrate support 130 supports several substrates 154, e.g., 25 to 100 substrates, in several gapped tiers in a substantially horizontal state, and is loaded into the reaction tube 142.

The adapter 144 has a gas supply port 156 and a gas exhaust port 159 that are integrated with the adapter 144. A gas inlet tube 160 is connected to the gas supply port 156, and an exhaust tube 162 is connected to the gas exhaust port 159.

Process gas introduced from the gas inlet tube 160 to the gas supply port 156 is supplied to the interior of the reaction tube 142 by way of a gas inlet channel 164 and a nozzle 166 disposed in the side wall of the adapter 144.

Next, the effects of the thermal process apparatus 110 configured in the manner described above are described.

In the description below, the operation of each component constituting the thermal process apparatus 110, i.e., the substrate process apparatus for carrying out thermal process, is controlled by a controller 170.

First, when a pod 116 containing a plurality of substrates 154 is set on a pod stage 114, the pod 116 is conveyed from the pod stage 114 to a pod shelf 120 with the aid of a pod conveyor 118 and is stocked in the pod shelf 120. The pod 116 stocked in the pod shelf 120 is conveyed to a pod opener 122 with the aid of the pod conveyor 118 and is set [in the pod opener], whereupon the lid of the pod 116 is opened by the pod opener 122, and the number of substrates 154 stored in the pod 116 is counted by the substrate counter 124.

The substrates 154 are removed from the pod 116 in the position of the pod opener 122 with the aid of a substrate transporter 126 and are transported to a notch aligner 128. In the notch aligner 128, notches are detected while the substrates 154 are rotated and aligned. The substrates 154 are subsequently removed from the notch aligner 128 by the substrate transporter 126 and transported to the substrate support 130.

In this manner, when a single batch of the substrates 154 is transported to the substrate support 130, the substrate support 130 filled with a plurality of substrates is inserted in the reactor 140 (reaction vessel 143), which has been set, e.g., to a temperature of about 600° C., and the interior of the reactor 140 is sealed by the seal cap 148 of the furnace port. The temperature inside the furnace is increased to the thermal process temperature, and process gas is introduced from the gas inlet tube 160 to the interior of the reaction tube 142 by way of the gas supply port 156 as well as the gas inlet channel 164 and nozzle 166 disposed in the side wall of the adapter 144. When the substrates are subjected to thermal process, the substrates are heated to a set temperature of 1,000° C., for example. In order to achieve the set temperature, the power supply regulating apparatus of the present invention is used as a portion of the controller 170 when the power supply to the heater 146 is regulated.

When the thermal process of the substrates 154 has been completed, the interior temperature of the furnace is lowered to a temperature of about 600° C., for example, and the substrate support 130 for supporting the thermal-processed substrates 154 is unloaded from the reactor 140. The substrate support 130 is held in a prescribed position until all of the substrates 154 supported by the substrate support 130 have been cooled. When the substrates 154 of the held substrate support 130 have cooled to a prescribed temperature, the substrates are removed from the substrate support 130 with the aid of the substrate transporter 126, transported to the empty pod 116 set in the pod opener 122, and accommodated [in the pod]. The pod 116 in which the substrates 154 are accommodated is transported to the pod shelf 120 or the pod stage 114 with the aid of the pod conveyor 118 to complete the series of processes.

The following effects are obtained in accordance with the power supply regulating apparatus of the embodiment as described above.

(1) Power source voltage fluctuations are incorporated as feed-forward control and load fluctuations are incorporated as feedback control into the feedback control of temperature control. Therefore, a control system having excellent temperature stability can be provided. Also, stable power control is made possible and the apparatus is easy to use.

(2) Since the control is zero crossing control, a highly efficient power supply regulating apparatus can be provided in which reactive power is substantially not produced and the power of the power source is used effectively.

(3) An existing temperature controller 9 is used, the output of the temperature controller is presented to the power control signal generation circuit 15, and the gate control signal of the IGBT is outputted. Therefore, maintaining compatibility with conventional systems is possible, and conversion from a conventional system to the present system can easily be made by making only slight modifications.

(4) Energy can be saved and required power can be obtained without waste by adopting a semiconductor inverter for high-speed switching power control as the power control circuit. In particular, the temperature response characteristics are excellent because an IGBT, which is a high-frequency element, is used, and advantageous application can be made to heater control in the vicinity of an instrumentation line that is sensitive to noise.

In the embodiment described above, in addition to temperature fluctuations, power source voltage fluctuations and load fluctuations are incorporated into [temperature] control. However, it is also possible to incorporate only power source voltage fluctuations into temperature fluctuation control, and it is alternatively also possible to incorporate only load fluctuations into temperature fluctuation control. With the former, the voltage fluctuations of the power supply are corrected, and a stable power supply can be obtained. With the latter, appropriate power can be supplied in response to load fluctuations of the heater.

The power supply regulating apparatus 21 of the embodiment described above can be mounted in a semiconductor manufacturing apparatus provided with the reactor shown in FIG. 6. The reactor 140 is composed of a quartz tube 142 and a cylindrical heater 146 that heats the silica tube 142 from the exterior. The power supply regulating apparatus of the embodiment is used to heat the heater 146. A high performance semiconductor device can be obtained because a stable heater temperature can be achieved by mounting the above-described power supply regulating apparatus in a semiconductor manufacturing apparatus.

BRIEF DESCRIPTION OF THE DRAWINGS

Key

1 AC power source
7 Heater
8 thermometric thermocouple
9 temperature controller
10 rectifier circuit
11 semiconductor inverter for high-speed switching power control
11a IGBT inverter
21 power supply regulating apparatus
14 power voltage/electric current feed-forward circuit
16 control voltage/electric current feedback circuit
15 power control signal generation circuit
22 power source fluctuation detection circuit
23 load fluctuation detection circuit
24 temperature fluctuation detection circuit

The invention claimed is:

1. A power supply regulating apparatus for supplying power from an AC power source to a heater, comprising:
a rectifier circuit that rectifies alternating current supplied from said AC power source;
a semiconductor inverter for high-speed switching power control that controls power rectified in said rectifier circuit using a control signal, and supplying controlled power to said heater;
a temperature fluctuation detection circuit that detects temperature fluctuations of said heater;
a power source fluctuation detection circuit that detects power source fluctuations of said AC power source from alternating current supplied from said AC power source to said rectifier circuit, or from power rectified in said rectifier circuit, the power source fluctuation detection circuit including a power voltage/electric current feed-forward circuit that detects the power fluctuation of the AC power source based on current input to or output from the rectifier circuit and voltage input to or output from the rectifier circuit and outputs a feed forward signal in accordance with the detected output;
a load fluctuation detection circuit that detects load fluctuations of said heater from the power supplied to said heater, the load fluctuation detection circuit including a control voltage/electric current feedback circuit that detects the load fluctuation of the heater based on current and voltage supplied to the heater, and outputs a feedback signal in accordance with the detected output; and
a power control signal generation circuit that calculates the amount of electric power to be supplied to said heater on the basis of detection results of said temperature fluctuation detection circuit, said power source fluctuation detection circuit, and said load fluctuation detection circuit, and that controls the duty ratio or the frequency of said control signal applied to said semiconductor inverter for power control in accordance with the calculation results,
wherein the load fluctuation detection circuit further includes:
a current transformer that measures the current supplied to the heater; and
a voltage measurement line that measures the voltage supplied to the heater,
wherein the control voltage/electric current feedback circuit:
detects the load fluctuation of the heater by obtaining a difference between the current measured by the current transformer and current set for the heater, and obtaining a difference between the voltage measured by the voltage measurement line and voltage set for the heater;
calculates an electric amount to be supplied to the heater based on the detection result of the load fluctuation; and
outputs a calculation result thus obtained as the feedback signal.

2. The power supply regulating apparatus of claim 1, wherein said semiconductor inverter for high-speed switching power control is composed of an IGBT.

3. A semiconductor manufacturing apparatus, comprising the power supply regulating apparatus of claim 1.

4. A power supply regulating apparatus for supplying power from an AC power source to a heater, comprising:
a rectifier circuit that rectifies a first AC power supplied from said AC power source;
a power control circuit that converts power rectified in said rectifier circuit into a second AC power using a control signal, and supplying said AC power to said heater;
a temperature fluctuation detection circuit that detects temperature fluctuations of said heater;
a power source fluctuation detection circuit that detects power source fluctuations of said AC power source from said first AC power supplied from said AC power source to said rectifier circuit, or from said power rectified in said rectifier circuit, the power source fluctuation detection circuit including a power voltage/electric current feed-forward circuit that detects the power fluctuation of the AC power source based on current input to or output from the rectifier circuit and voltage input to or output from the rectifier circuit and outputs a feed forward signal in accordance with the detected output;
a load fluctuation detection circuit that detects load fluctuations of said heater from said second AC power supplied to said heater, the load fluctuation detection circuit including a control voltage/electric current feedback circuit that detects the load fluctuation of the heater based on current and voltage supplied to the heater, and outputs a feedback signal in accordance with the detected output; and
a power control signal generation circuit that calculates the amount of electric power to be supplied to said heater on the basis of detection results of said temperature fluctuation detection circuit, said power source fluctuation detection circuit, and said load fluctuation detection circuit, and that controls the duty ratio or the frequency of said control signal applied to said power control circuit in accordance with the calculation results,
wherein the load fluctuation detection circuit further includes:

a current transformer that measures the current supplied to the heater; and
a voltage measurement line that measures the voltage supplied to the heater,
wherein the control voltage/electric current feedback circuit:
detects the load fluctuation of the heater by obtaining a difference between the current measured by the current transformer and current set for the heater, and obtaining a difference between the voltage measured by the voltage measurement line and voltage set for the heater;
calculates an electric amount to be supplied to the heater based on the detection result of the load fluctuation; and
outputs a calculation result thus obtained as the feedback signal.

5. A power supply regulating apparatus for supplying power from an AC power source to a heater, comprising:
a rectifier circuit that rectifies a first AC power supplied from said AC power source;
a power control circuit that converts power rectified in said rectifier circuit into a second AC power using a control signal, and supplying said AC power to said heater;
a temperature fluctuation detection circuit that detects temperature fluctuations of said heater;
a load fluctuation detection circuit that detects load fluctuations of said heater from said second AC power supplied to said heater, the load fluctuation detection circuit including a control voltage/electric current feedback circuit that detects the load fluctuation of the heater based on current and voltage supplied to the heater, and outputs a feedback signal in accordance with the detected output; and
a power control signal generation circuit that calculates the amount of electric power to be supplied to said heater on the basis of detection results of said temperature fluctuation detection circuit and said load fluctuation detection circuit, and controlling the duty ratio or the frequency of said control signal applied to said power control circuit in accordance with the calculation results,
wherein the load fluctuation detection circuit further includes:
a current transformer that measures the current supplied to the heater; and
a voltage measurement line that measures the voltage supplied to the heater;
wherein the control voltage/electric current feedback circuit:
detects the load fluctuation of the heater by obtaining a difference between the current measured by the current transformer and current set for the heater, and obtaining a difference between the voltage measured by the voltage measurement line and voltage set for the heater;
calculates an electric amount to be supplied to the heater based on the detection result of the load fluctuation; and
outputs a calculation result thus obtained as the feedback signal.

6. A method for controlling power to a heater, for rectifying a first AC power supplied from an AC power source, converting the rectified power by a power control circuit to a second AC power using a control signal inputted to the power control circuit, and supplying the second AC power to a heater, said method comprising:

detecting temperature fluctuations of the heater, power source fluctuations of said AC power source from said first AC power or the rectified output prior to conversion to said second AC power by measuring current and voltage of the first AC power or the rectified output prior to conversion to the second AC power, and load fluctuations of said heater from said second AC power supplied to said heater by measuring current and voltage supplied to the heater;
calculating the amount of electric power to be supplied to said heater on the basis of the detection results and controlling the duty ratio or the frequency of said control signal in accordance with the calculation results so as to incorporate into the feedback control for said temperature fluctuation feed-forward control for said power source fluctuations and feedback control for said load fluctuations; and
measuring the current and the voltage supplied to the heater, and detecting the load fluctuation by obtaining a difference between the measured current and voltage and current and voltage set for the heater.

7. A semiconductor manufacturing apparatus, comprising the power supply regulating apparatus of claim 2.

8. A power supply regulating apparatus for supplying power from an AC power source to a heater, comprising:
an IGBT inverter for converting a first AC power of said AC power source into a second AC power correlated with duty ratio or frequency of a control signal generated as a standard in zero crossing point of said first AC power and supplying said second AC power to said heater;
a temperature fluctuation detection circuit that detects temperature fluctuations of said heater;
a power source fluctuation detection circuit that detects power source fluctuations of said AC power source from said first AC power supplied from said AC power to said power supply regulating apparatus, the power source fluctuation detection circuit including a power voltage/electric current feed-forward circuit that detects the power fluctuation of the AC power source based on current and voltage of the first AC power, and outputs a feed forward signal in accordance with the detected output;
a load fluctuation detection circuit that detects load fluctuations of said heater from said second AC power supplied to said heater, the load fluctuation detection circuit including a control voltage/electric current feedback circuit that detects the load fluctuation of the heater based on current and voltage of the second AC power, and outputs a feedback signal in accordance with the detected output;
a power control signal generation circuit that controls the duty ratio or the frequency of said control signal on the basis of detection results of said temperature fluctuation detection circuit, said power source fluctuation detection circuit and said load fluctuation detection circuit results so as to incorporate into the feedback control for said temperature fluctuation feed-forward control for said power source fluctuations and feedback control for said load fluctuations,
wherein the load fluctuation detection circuit further includes:
a current transformer that measures the current supplied to the heater; and
a voltage measurement line that measures the voltage supplied to the heater,
wherein the control voltage/electric current feedback circuit:

detects the load fluctuation of the heater by obtaining a difference between the current measured by the current transformer and current set for the heater, and obtaining a difference between the voltage measured by the voltage measurement line and voltage set for the heater;

calculates an electric amount to be supplied to the heater based on the detection result of the load fluctuation; and outputs a calculation result thus obtained as the feedback signal.

9. A method for manufacturing a semiconductor device for loading a substrate into a reactor, then supplying AC power to a heater provided around the reactor from an AC power source via a supply power regulator for regulating power supplied to the heater, and applying thermal process to the substrate, said method comprising;

detecting temperature fluctuations of the heater, power source fluctuations of the AC power source by measuring current and voltage of the AC power source, and load fluctuations of the heater by measuring current and voltage supplied to the heater;

generating a control signal so as to incorporate into feedback control for temperature fluctuation of said heater feed-forward control for power source fluctuations of said AC power source and feedback control for load fluctuations of said heater;

generating the control signal as a standard in zero crossing point of first AC power of the AC power source;

converting the first AC power of the AC power source into second AC power in accordance with duty ratio or frequency of the control signal;

supplying said second AC power to said heater;

measuring current and voltage supplied to the heater; and detecting the load fluctuation by obtaining a difference between the measured current and voltage and current and voltage set for the heater.

* * * * *